United States Patent
Zhao et al.

[11] Patent Number: 5,953,631
[45] Date of Patent: Sep. 14, 1999

[54] LOW STRESS, HIGHLY CONFORMAL CVD METAL THIN FILM

[75] Inventors: Joe W. Zhao, San Jose; Wilbur G. Catabay, Santa Clara, both of Calif.

[73] Assignee: LSI Logic Corporation, Milpitas, Calif.

[21] Appl. No.: 08/592,870

[22] Filed: Jan. 24, 1996

[51] Int. Cl.⁶ .................................................. H01L 21/44
[52] U.S. Cl. .......................................... 438/683; 438/680
[58] Field of Search ........................... 437/190, 192; 438/482, 527, 528, 529, 564, 660, 680, 683

[56] References Cited

U.S. PATENT DOCUMENTS

| | | | |
|---|---|---|---|
| 5,529,953 | 6/1996 | Shoda | 437/189 |
| 5,591,671 | 1/1997 | Kim et al. | 437/190 |
| 5,599,739 | 2/1997 | Merchant et al. | 437/190 |

*Primary Examiner*—Chandra Chaudhari
*Assistant Examiner*—Reneé R. Berry

[57] ABSTRACT

A method is presented for depositing a low stress, highly conformal metal thin film, such as tungsten, on a substrate. A substrate is provided, and is heated to a first temperature. A first portion of the metal thin film is deposited on the substrate by reacting a first set of process gases. The deposition of the first portion of the metal thin film is stopped after a first length of time, and the substrate is heated to a second temperature, which is greater than the first temperature. A second portion of the metal thin film is deposited on the substrate by reacting a second set of process gases. The second portion of the metal thin film comprises the same metal as the first portion of the metal thin film. The deposition of the second portion of the metal thin film is stopped after a second length of time. Semiconductor devices having a low stress, highly conformal thin film are also described.

10 Claims, 2 Drawing Sheets

LOW STRESS, HIGHLY CONFORMAL CVD METAL THIN FILM

FIELD OF THE INVENTION

This invention relates to the field of metal deposition. More particularly the invention relates to the field of depositing a metal thin film on a semiconductor substrate during the formation of an integrated circuit.

BACKGROUND OF THE INVENTION

Metal is deposited on a semiconductor substrate as a thin film to form electrical interconnections between the devices formed in the substrate. It is desirable for the metal thin film to deposit on the substrate surface in a conformal fashion so as to reduce voids, such as gaps and pinholes. Voids tend to form at the interface between the metal thin film and the substrate.

Voids are undesirable in a completed device because, when the device is in use, the flow of electrons around the voids tends to enlarge the voids according to a phenomenon called electromigration. As the voids grow in size, and the metal pathway conducting the current is correspondingly reduced, the reliability of the integrated circuit decreases. In time, one or more voids may grow to the point that the electrical circuit opens, and the device fails.

Thin films exhibiting a high degree of conformity with the substrate, may tend to also have a high degree of internal stress. The internal stress of the thin film can be sufficient to warp the substrate. This creates problems during subsequent processing of the substrate. The stress in the thin film can also create problems with loss of adhesion between the thin film and the substrate (delamination), or cracking of the metal thin film.

It is an object of the present invention, therefore, to provide a method of metal deposition that produces a metal thin film having a high degree of conformity to the substrate. A desired method should also produce reduced numbers of voids at the interface between the metal and the substrate and possess a low degree of internal stress.

SUMMARY OF THE INVENTION

The above and other objects are met by a method according to the present invention for depositing a low stress, highly conformal metal thin film on a substrate. According to the method, a substrate is provided, and is heated to a first temperature. A first portion of the metal thin film is deposited on the substrate by reacting a first set of process gases. The deposition of the first portion of the metal thin film is stopped after a first length of time. The substrate is then heated to a second temperature, which is greater than the first temperature. A second portion of the metal thin film is deposited on the substrate by reacting a second set of process gases. The second portion of the metal thin film comprises the same metal as the first portion of the metal thin film. The deposition of the second portion of the metal thin film is stopped after a second length of time. The present invention also provides an integrated circuit device having a low stress, highly conformal metal thin film as a metal interconnect layer.

BRIEF DESCRIPTION OF THE DRAWINGS

Further advantages of the invention will become apparent by reference to the detailed description of the invention when considered in conjunction with the following drawings, in which like reference numerals denote like elements throughout the several views, and wherein.

DETAILED DESCRIPTION OF THE INVENTION

Figure 2:
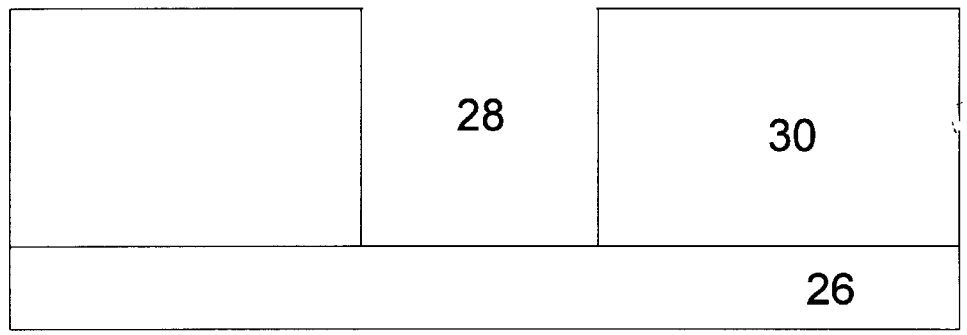
FIG. 2 is a cross-sectional view of a substrate.

Referring now to FIG. 2, a substrate 26 is provided on which the metal is to be deposited. The substrate 26 may be an insulating type substrate if the devices to be formed thereon are to be passive devices. However, more typically the substrate 26 will be a semiconducting material such as germanium, III–V compounds such as gallium arsenide, or most preferably silicon. Such substrates are commonly used in the manufacture of integrated semiconductor devices such as, by way of example and not limitation, PROM, EPROM, EEPROM, PAL, FPL, ROM, RAM, and ASIC. All such semiconductor devices with metal interconnect layers may be benefited by application of a method according to the present invention.

The substrate 26 usually will have received processing prior to the step of metal deposition. This processing, for example such as that used to manufacture semiconductor devices, will have created one or more topographical features on the surface of the substrate 26, such as via 28. Via 28 is typically formed by overlaying substrate 26 with a layer of another material, such as silicon oxide 30. The layer of silicon oxide 30 is then etched to form via 28.

The topographical features on the surface of the substrate 26 tend to be difficult to cover conformally with metal. Thus, during a metal deposition process, voids such as gaps in the crevices of features such as via 28, and pinholes will tend to form. While it is not essential to the invention that the substrate 26 have such topographical features, the invention is particularly suited to substrates 26 with topographical features. Substrates 26 with such features tend to have the greatest problem with voids. The present invention addresses that problem, reducing or preferably eliminating such voids.

Figure 1:
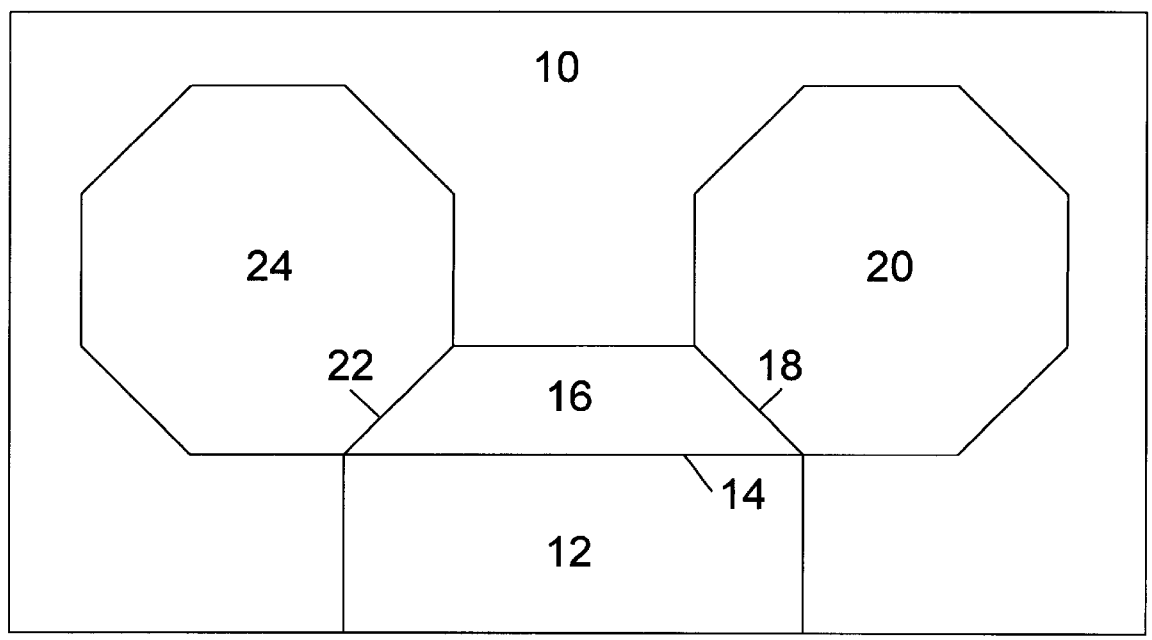
FIG. 1 is a top plan view of a cluster tool.

According to the invention, metal is deposited on the substrate 26. The invention is applicable to any metal which can be formed using chemical vapor deposition techniques (CVD). Such metals include, by way of example and not limitation, W, Mo, Ta, Ti, Cr, as well as alloys and nitrides of these metals. For the sake of explanation, the specific example of tungsten will be used. The metal is deposited on the substrate 26 by CVD. The metal is deposited by placing the substrate 26 within a cluster deposition system, such as depicted in FIG. 1, in which the processing conditions may be precisely controlled.

A cluster deposition system is appropriate for the method described herein. Such systems include, by way of example, model P5000 or Xz manufactured by AMAT of Santa Clara, Calif., model Phoenix manufactured by MRC of Phoenix, Ariz., and model 8000 manufactured by Genus of Santa Clara, Calif.

The substrate 26 is brought into the cluster deposition system, or cluster tool, 10 by placing it in the automated staging area 12. From there the substrate 26 is brought through air lock 14 into the common area 16. Once the substrate 26 is brought inside of the common area 16, the air lock 14 is closed, and a vacuum is formed within the common area 16. After the vacuum is formed, air lock 18 is opened and the substrate 26 is introduced to the deposition chamber 20. The air lock 18 is closed once the substrate 26 is placed within the deposition chamber 20.

The substrate 26 is heated to a first temperature of between about 350° C. and about 450° C., and most preferably about 400° C. A first set of process gases is introduced to the substrate 26 in the deposition chamber 20 at controlled rates. The pressure within the chamber is maintained at between about 1 Torr and about 50 Torr, and most preferably about 30 Torr.

Figure 3:
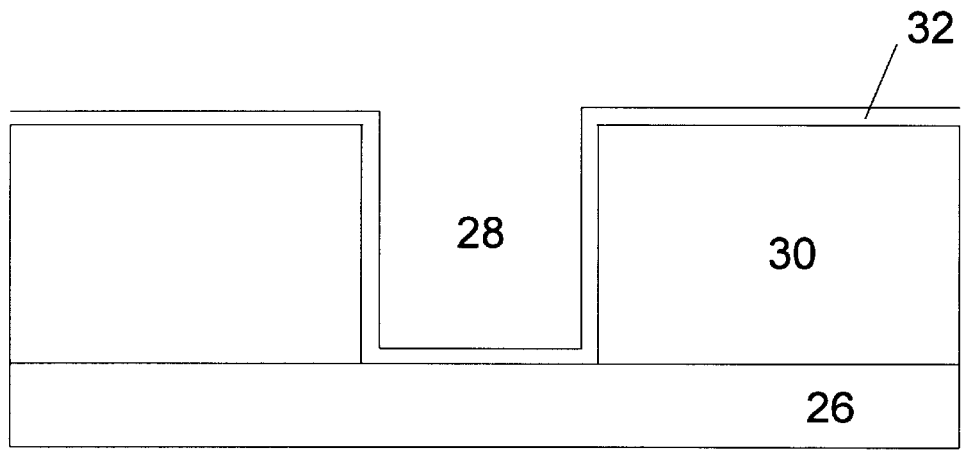
FIG. 3 is a cross-sectional view of a first portion of a metal thin film on a substrate.

According to a preferred method of the invention, three different gases are introduced into the deposition chamber 20. These gases react with each other at the temperature and pressure specified above to form a first portion 32 of the tungsten thin film on the substrate 26, as depicted in FIG. 3. $WF_6$ is introduced into the deposition chamber 20 at a flow rate of between about 10 sccm and about 100 sccm, and most preferably about 30 sccm. $SiH_4$ is introduced at a flow rate of between about 5 sccm and about 50 sccm, and most preferably about 15 sccm. $H_2$ is introduced at a flow rate of between about 500 sccm and about 2,000 sccm, and most preferably about 1,000 sccm.

The process gases of the first set are allowed to flow into the deposition chamber 20 for length of time sufficient to deposit the desired thickness of the first portion 32 of the metal thin film on the substrate 26. Preferably the first portion 32 of the tungsten thin film is deposited on the substrate 26 to a thickness of between about 1 kÅ and about 7 kÅ.

At the above-stated conditions, using a relatively low temperature, the first portion 32 of the tungsten thin film produced will be highly conformal to the substrate. This eliminates many of the voids that would form in films produced at higher temperatures. However, the first portion 32 of the tungsten thin film may also have a relatively high degree of internal stress. For example, the stresses may range between about $1.5 \times 10^{10}$ dynes/cm$^2$ and about $2 \times 10^{10}$ dynes/cm$^2$.

The deposition of the second portion of the tungsten thin film 32 may be done in the same deposition chamber 20 in which the first portion 32 of the tungsten thin film was deposited. Preferably, the second deposition is done in a separate deposition chamber 24, as depicted in FIG. 1. The substrate 26 is removed from the deposition chamber 20 by opening air lock 18 and moving the substrate 26 into the common area 16. The air lock 18 is closed, and air lock 22 is opened, through which the substrate 26 may be moved into deposition chamber 24. The air lock 22 is closed, and processing continues.

The substrate 26 is heated to a second temperature of between about 450° C. and about 475° C., and most preferably about 475° C., which is greater than the first temperature. The pressure is controlled at between about 20 Torr and about 150 Torr, and most preferably about 80 Torr. A second set of process gases are introduced to the substrate 26 in deposition chamber 24 at controlled rates. Preferably the second set of deposition gases are different than the first set, but in alternate embodiments the second set is identical to the first set.

Figure 4:
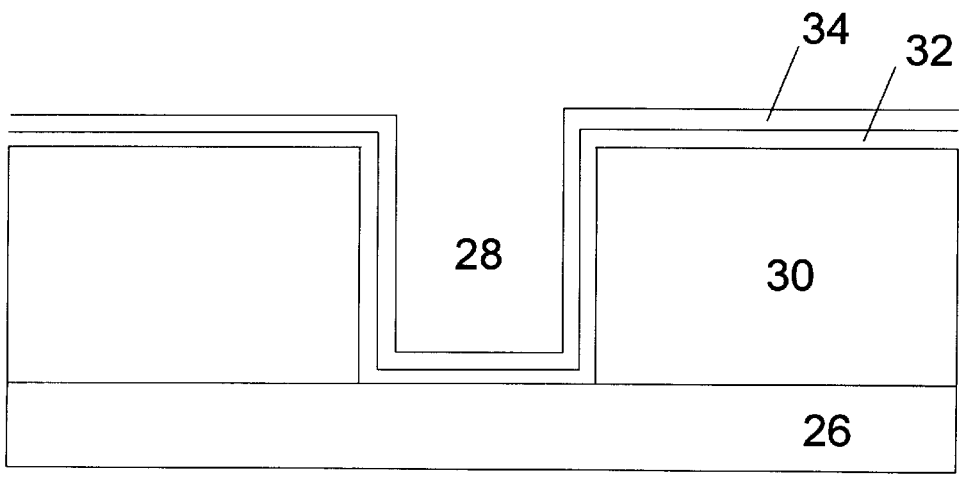
FIG. 4 is a cross-sectional view of a second portion of a metal thin film on a substrate.

According to a preferred method of the invention, the second set of gases react with each other at the temperature and pressure specified above to form a second portion 34 of the tungsten thin film on the substrate 26, as depicted in FIG. 4. In an especially preferred embodiment, $WF_6$ is introduced into deposition chamber 24 at a flow rate of between about 30 sccm and about 100 sccm, and most preferably about 75 sccm, and $H_2$ is introduced into the deposition chamber 24 at a flow rate of between about 1,000 sccm and about 2,000 sccm, and most preferably about 1,500 sccm.

The process gases of the second set are allowed to flow into the deposition chamber 24 for length of time sufficient to deposit the desired thickness of the second portion 34 of the metal thin film on the substrate 26. Preferably the second portion 34 of the tungsten thin film is deposited on the substrate 26 to a thickness of between about 2 kÅ and about 10 kÅ. At these conditions, the second portion 34 of the tungsten thin film produced will tend to have a relatively low internal stress. For example, the internal stress may range between about $1 \times 10^9$ dynes/cm$^2$ and about $1.2 \times 10^{10}$ dynes/cm$^2$.

In the preferred embodiment the ratio of the thickness of the first portion 32 of the thin film to the thickness of the second portion 34 of the thin film will be between about 1.0:1.0 and about 1.0:2.0, and most preferably about 1.0:1.5. By keeping the ratio of thicknesses within these ranges, the metal thin film produced will have more optimal properties, as explained below.

By depositing the first portion 32 of the tungsten thin film at a relatively low temperature, the first portion 32 is formed as a highly conformal thin film on the substrate 26. Thus, the first portion 32 has a substantially reduced number of voids, such as gaps between the first portion 32 and the substrate 26, or pinholes from the upper surface of the first portion 32 down to the substrate 26, as compared to a metal thin film deposited at a higher temperature.

However, the first portion 32 may have a high degree of internal stress, as described above. If the entire metal thin film were formed using a low temperature process, there would be a higher probability of device failure because of metal thin film cracking or delamination. Also, subsequent processing would be complicated by substrate 26 warpage. Thus, according to the invention, only a first portion 32 of the metal thin film is deposited using the low temperature process.

The second portion 34 of the metal thin film is deposited using a high temperature process. The second portion 34 may have a greater incidence of gaps and pinholes as compared to the first portion 32, but none of these voids extend through to the surface of the substrate 26. This is due to the presence of the highly conformal first portion 32.

Additionally, the second portion 34 is formed with far less internal stress as compared to the first portion 32. Thus the low stress second portion 34 acts to counteract the stresses within the first portion 32, and produces a metal thin film with a reduced bulk stress. For tungsten thin films, discussed above, the bulk stress may vary between about $1 \times 10^{10}$ dynes/cm$^2$ and about $1.3 \times 10^{10}$ dynes/cm$^2$. Therefore, the present invention reduces or preferably eliminates problems associated with the high stress metal thin films, as well as problems associated with metal thin films having a significant number of voids. The benefits of each portion 32 and 34 are used to temper the drawbacks of the other portion.

While specific embodiments of the invention have been described with particularity above, it will be appreciated that the invention is equally applicable to numberless processes well known to those skilled in the art.

What is claimed is:

1. A method of depositing a low stress, highly conformal metal thin film on a substrate comprising:

providing a substrate having an exposed surface, heating the substrate to a first temperature, depositing a voidless first portion of the metal thin film having a first given internal stress on substantially all of the exposed surface of the substrate by reacting a first set of process gases, stopping the deposition of the first portion of the metal thin film after a first length of time, heating the substrate to a second temperature which is greater than the first temperature, depositing a second portion of the metal thin film having a second given internal stress that is lower than the first given internal stress on substantially all of the exposed surface of the substrate by reacting a second set of process gases, where the second portion of the metal thin film comprises the same metal as the first portion of the metal thin film, and stopping the deposition of the second portion of the metal thin film after a second length of time, wherein the ratio of the thickness of the first portion of the thin film to the thickness of the second portion of the thin film is between about 1.0:1.0 and about 1.0:2.0.

2. The method of claim 1 wherein the substrate comprises a semiconductor material, and the metal is selected from the group consisting of W, Mo, Ta, Ti, Cr, their alloys, and their nitrides.

3. The method of claim 1 wherein the substrate further comprises silicon.

4. The method of claim 1 wherein the substrate further comprises semiconducting devices having vias.

5. The method of claim 1 wherein the metal is tungsten and the first set of process gases comprise $WF_6$, $SiH_4$, and $H_2$.

6. The method of claim 5 wherein the first temperature is between about 350° C. and about 450° C.

7. The method of claim 5 wherein the second set of process gases comprise $WF_6$ and $H_2$.

8. The method of claim 7 wherein the second temperature is between about 450° C. and about 475° C.

9. A method of depositing a low stress, highly conformal tungsten thin film on a silicon substrate comprising:

providing a silicon substrate having an exposed surface, heating the substrate to a first temperature of between about 350° C. and about 450° C., depositing a voidless first portion of the tungsten thin film having a first given internal stress on substantially all of the exposed surface of the substrate by reacting gaseous $WF_6$, $SiH_4$, and $H_2$ at a pressure between about 1 Torr and about 50 Torr;

the flow rate of the $WF_6$ being between about 10 sccm and about 100 sccm, the flow rate of the $SiH_4$ being between about 5 sccm and about 50 sccm, and the flow rate of the $H_2$ being between about 500 sccm and about 2,000 sccm, heating the substrate to a second temperature which is greater than the first temperature, the second temperature being between about 450° C. and about 475° C., and depositing a second portion of the tungsten thin film having a second given internal stress that is lower than the first given internal stress on substantially all of the exposed surface of the substrate by reacting gaseous $WF_6$ and $H_2$ at a pressure between about 20 Torr and about 150 Torr, the flow rate of the $WF_6$ being between about 30 sccm and about 100 sccm, and the flow rate of the $H_2$ being between about 1,000 sccm and about 2,000 sccm, wherein the ratio of the thickness of the first portion of the tungsten thin film to the thickness of the second portion of the tungsten thin film is between about 1.0:1.0 and about 1.0:2.0.

10. The method of claim 9 wherein the substrate further comprises semiconducting devices having vias.

* * * * *